United States Patent
Lee

(10) Patent No.: US 6,909,665 B2
(45) Date of Patent: Jun. 21, 2005

(54) SEMICONDUCTOR MEMORY DEVICE HAVING HIGH-SPEED INPUT/OUTPUT ARCHITECTURE

(75) Inventor: Hi-Choon Lee, Yogin (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/773,464

(22) Filed: Feb. 9, 2004

(65) Prior Publication Data

US 2004/0223354 A1 Nov. 11, 2004

(30) Foreign Application Priority Data

Feb. 10, 2003 (KR) .................................. 10-2003-0008207

(51) Int. Cl.$^7$ ................................................. G11C 8/00
(52) U.S. Cl. .............. 365/233; 365/230.04; 365/230.06
(58) Field of Search ........................... 365/233, 230.04, 365/230.06, 203

(56) References Cited

U.S. PATENT DOCUMENTS

| | | |
|---|---|---|
| 5,237,532 A | 8/1993 | Sahara et al. |
| 5,640,358 A * | 6/1997 | Monden ................. 365/230.04 |
| 5,708,623 A * | 1/1998 | Choi ............................ 365/233 |

* cited by examiner

Primary Examiner—Huan Hoang
(74) Attorney, Agent, or Firm—Volentine Francos & Whitt PLLC

(57) ABSTRACT

A frequency divider divides the external clock signal by two and generates a first clock signal for an even-numbered data patch and a second clock signal for an odd-numbered data, wherein the first clock signal is opposite in phase to the second clock signal. A column selection line enable control circuit generates even-numbered column selection line enable signals in response to the first clock signal and generates odd-numbered column selection line enable signals in response to the second clock signal. A switching circuit connects a pair of bit lines to a pair of even-numbered input/output (I/O) lines in response to the even-numbered column selection line enable signals and connects the pair of bit lines to a pair of odd-numbered I/O lines in response to the odd-numbered column selection line enable signals. An I/O line sense amplification circuit senses and amplifies even-numbered read data from the pair of even-numbered I/O lines and outputs the amplified even-numbered read data to a pair of data lines in response to the first clock signal, and senses and amplifies odd-numbered read data from the pair of odd-numbered I/O lines and outputs the odd-numbered read data to the pair of data lines in response to the second clock signal.

4 Claims, 4 Drawing Sheets

SEMICONDUCTOR MEMORY DEVICE HAVING HIGH-SPEED INPUT/OUTPUT ARCHITECTURE

BACKGROUND OF THE INVENTION

1. Field of the Invention

The present invention generally relates to a semiconductor memory device, and more particularly, the present invention relates to a semiconductor memory device having an input/output architecture which allows for an increase in write and read operation speeds.

A claim of the priority is made to Korean Patent Application No. 2003-8207, filed on Feb. 10, 2003, in the Korean Intellectual Property Office, the disclosure of which is incorporated herein in its entirety by reference.

2. Description of the Related Art

In a semiconductor memory device, particularly a dynamic random access memory (DRAM), it is important to maximize the input/output data rate during high-speed write and read operations. To this end, a data prefetch structure is generally adopted in the input/output architecture of the DRAM.

During a read operation, the data prefetch structure is characterized in that multi-bit data is simultaneously read in parallel from a memory core of DRAM at a low speed and is output in series to the outside of the memory at a high speed. During a write operation, data is input in parallel from the outside of the memory at a high speed and the input data is written in series to the memory at a low speed.

As a result, the number of prefetch cells that needs to be accessed in parallel must be increased in order to enhance the operating speed of the DRAM. However, an increase in the number of prefetch cells results in an increase in noise, and the random selection of columns can be restricted. As a result, the efficiency of read/write operations can be reduced.

FIG. 1 is a circuit diagram of a conventional semiconductor memory device having a conventional input/output architecture. FIG. 2 is a timing diagram illustrating a read operation of the semiconductor memory device of FIG. 1.

Referring to FIGS. 1 and 2, a column address decoder 11 decodes a column address ADD that is externally input to the semiconductor memory device and provides the decoded result to a column selection line enable control circuit 12. The column selection line enable control circuit 12 receives the decoded result and generates corresponding column selection line enable signals CSLi, CSLj, . . . , and CSLk, in response to a clock signal CLK.

In response to the column selection line enable signals CSLi, CSLj, . . . , and CSLk, a switching circuit 13 selectively connects pairs of bit lines BLi, BLj, . . . ,BLk to a pair of input/output (I/O) lines IO. The pairs of bit lines BLi, BLj, . . . ,BLk are connected to memory cells MCi, MCj, . . . , MCk in a memory cell array 10, respectively, During a read operation, an I/O line sense amplification circuit IOSA 14a senses and amplifies data from the pair of I/O lines IO, and outputs the data to a pair of data lines DIO, in response to a clock signal CLK. The data from the pair of data lines DIO is input to an I/O pin DQ via an I/O buffer 16. A precharge circuit 15 precharges the pair of I/O lines IO in response to a falling edge of the clock signal CLK.

During a write operation, a write driver DRV 14b receives data from the pair of data lines DIO input via the I/O buffer 16, and transmits the data to the pair of I/O lines IO, in response to the clock signal CLK. The data from the pair of I/O lines IO is written to the memory cells MCi, MCj, . . . , MCk using the switching circuit 13.

Although not shown in the drawings, a register may be installed around the I/O buffer 16. The register enables a high-speed input/output operation by simultaneously reading multi-bit data in parallel and converting the data format from parallel to series.

In a semiconductor memory device with a conventional I/O structure, a read operation requires development and precharging of the pair of I/O lines IO before the next read operation. In fact, development and precharging of the pair of I/O lines IO must be made within a period of the clock signal CLK. However, the higher the integration of the semiconductor memory device, the more loads that are applied onto the pair of I/O lines 10. Furthermore, as the data input/output operation speed of the semiconductor memory device increases, it becomes more difficult to coordinate the development and precharging of the pair of I/O lines IO within a period of the clock signal CLK. These restrictions limit the ability to increase the write and read operation speeds of a semiconductor memory device having a conventional input/output structure.

SUMMARY OF THE INVENTION

The present invention provides a semiconductor memory device having an input/output structure in which write and read operations can be performed at high speeds.

According to an aspect of the present invention, there is provided a semiconductor memory device that performs read and write operations in synchronization with an external clock signal. The device includes a frequency divider, a column selection line enable control circuit, a switching circuit, and an I/O line sense amplification circuit. The frequency divider divides the external clock signal by two and generates a first clock signal for an even-numbered data patch and a second clock signal for an odd-numbered data, where the first clock signal is opposite in phase to the second clock signal. The column selection line enable control circuit generates even-numbered column selection line enable signals in response to the first clock signal and generates odd-numbered column selection line enable signals in response to the second clock signal. The switching circuit connects a pair of bit lines to a pair of even-numbered input/output (I/O) lines in response to the even-numbered column selection line enable signals and connects the pair of bit lines to a pair of odd-numbered I/O lines in response to the odd-numbered column selection line enable signals. The I/O line sense amplification circuit senses and amplifies even-numbered read data from the pair of even-numbered I/O lines and outputs the amplified even-numbered read data to a pair of data lines in response to the first clock signal, and senses and amplifies odd-numbered read data from the pair of odd-numbered I/O lines and outputs the odd-numbered read data to the pair of data lines in response to the second clock signal.

The semiconductor memory device may further include a column address decoder that decodes an externally supplied column address and that provides the decoded column address to the column selection line enable control circuit.

The semiconductor memory device may still further include a write driver that receives even-numbered write data from the pair of data lines and provides the even-numbered write data to the pair of even-numbered I/O lines in response to the first clock signal, and that receives odd-numbered write data from the pair of data lines and provides the odd-numbered write data to the pair of odd-numbered I/O lines in response to the second clock signal.

The semiconductor device may further include a first precharge circuit that precharges the pair of even-numbered I/O lines in response to the first clock signal, and a second precharge circuit that precharges the pair of odd-numbered I/O lines in response to the second clock signal.

BRIEF DESCRIPTION OF THE DRAWINGS

The above and other aspects and advantages of the present invention will become readily apparent from the detailed description that follows, with reference to the accompanying drawings, in which.

DETAILED DESCRIPTION OF THE PREFERRED EMBODIMENTS

Figure 1:
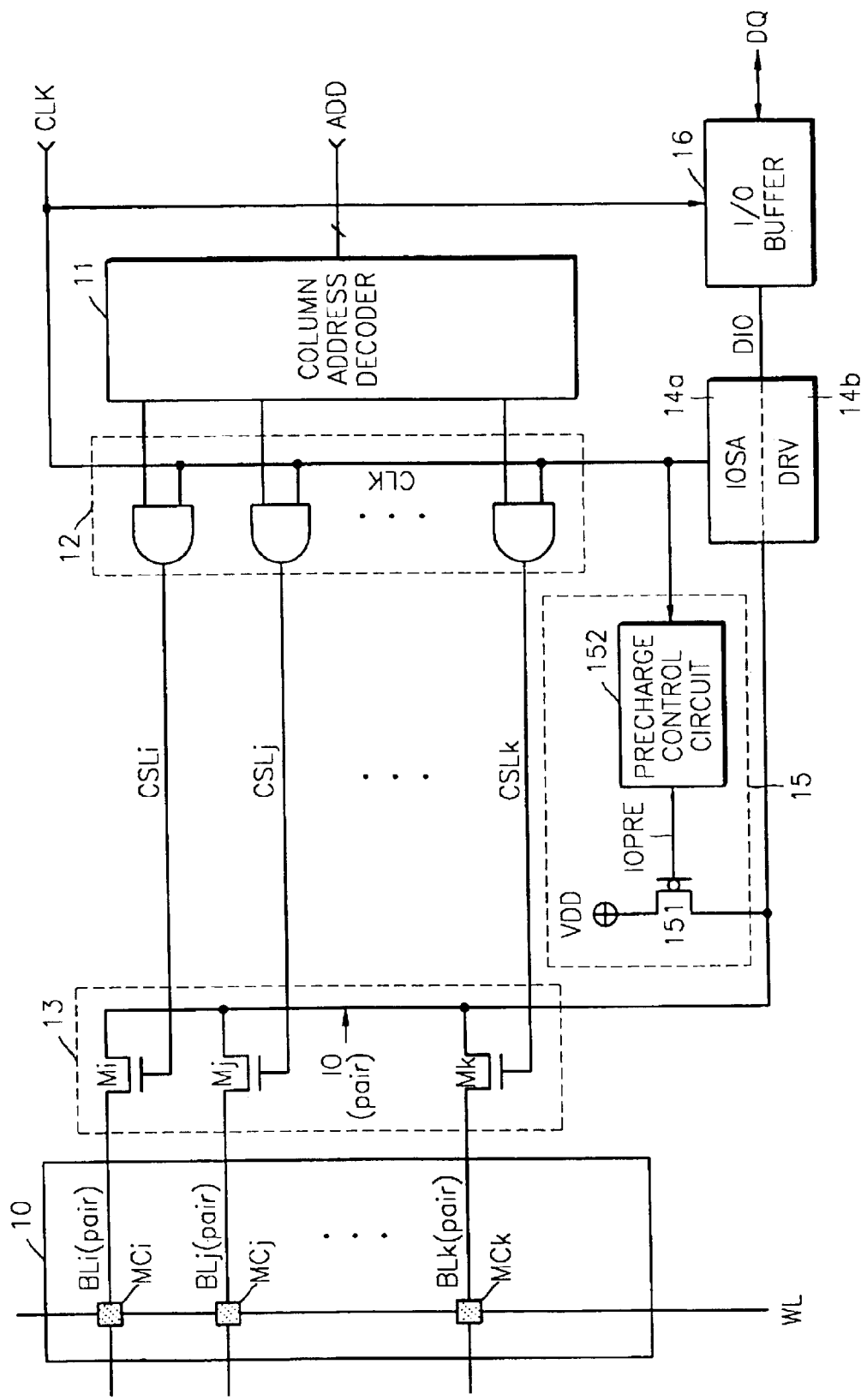
FIG. 1 is a circuit diagram of a conventional semiconductor memory device having a conventional input/output architecture.
Figure 2:
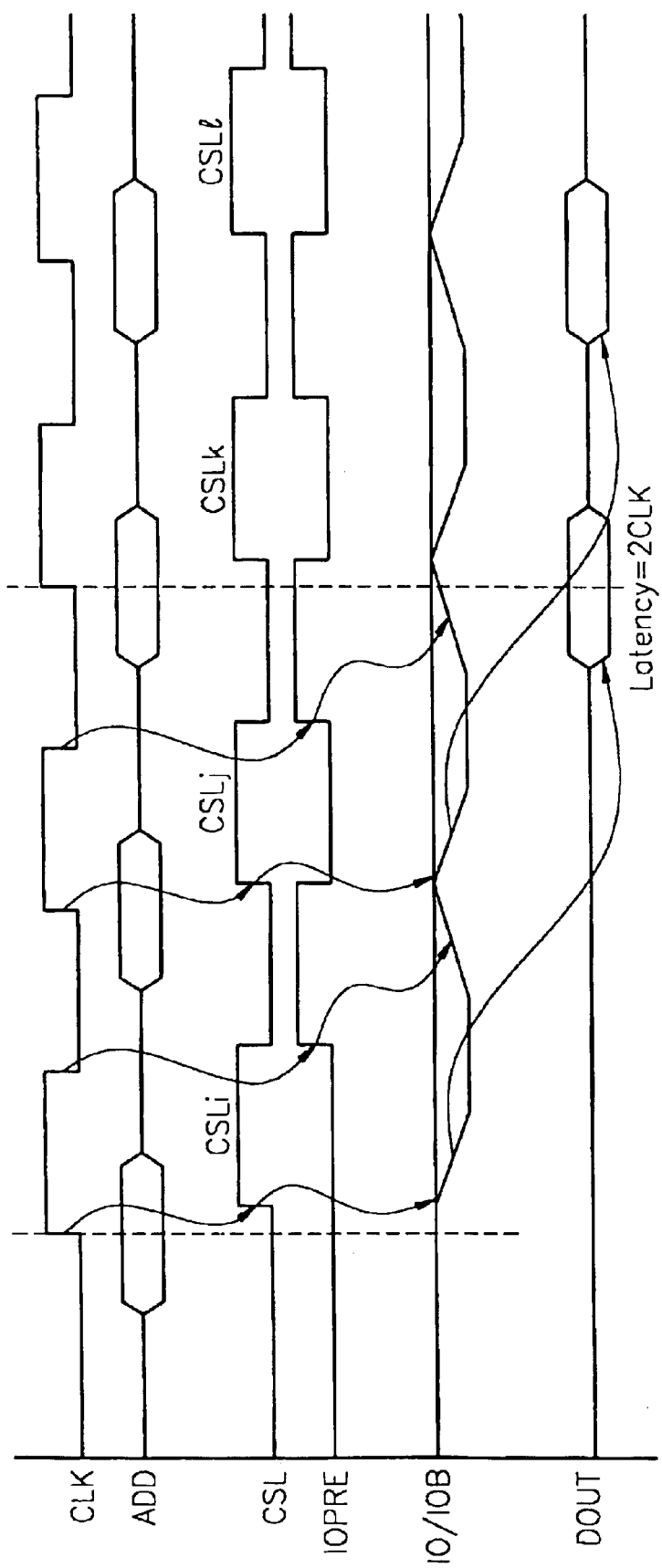
FIG. 2 is a timing diagram illustrating a read operation of the semiconductor memory device of FIG. 1.

The present invention will now be described more fully with reference to the accompanying drawings, in which preferred embodiments of the invention are shown. Here, the same reference numerals or characters represent the same elements throughout the drawings.

Figure 3:
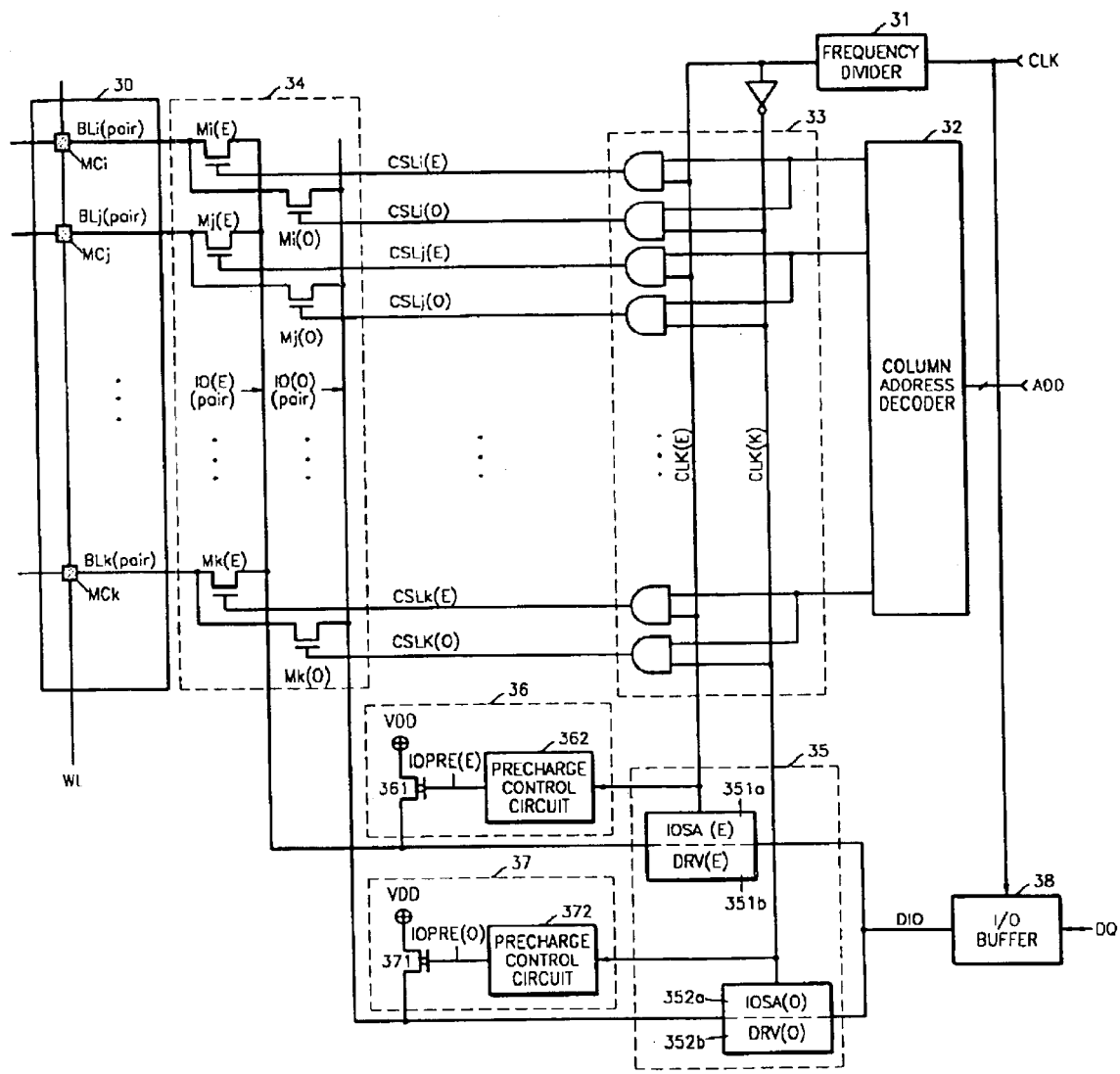
FIG. 3 is a circuit diagram of a semiconductor memory device having an input/output architecture according to a preferred embodiment of the present invention.
Figure 4:
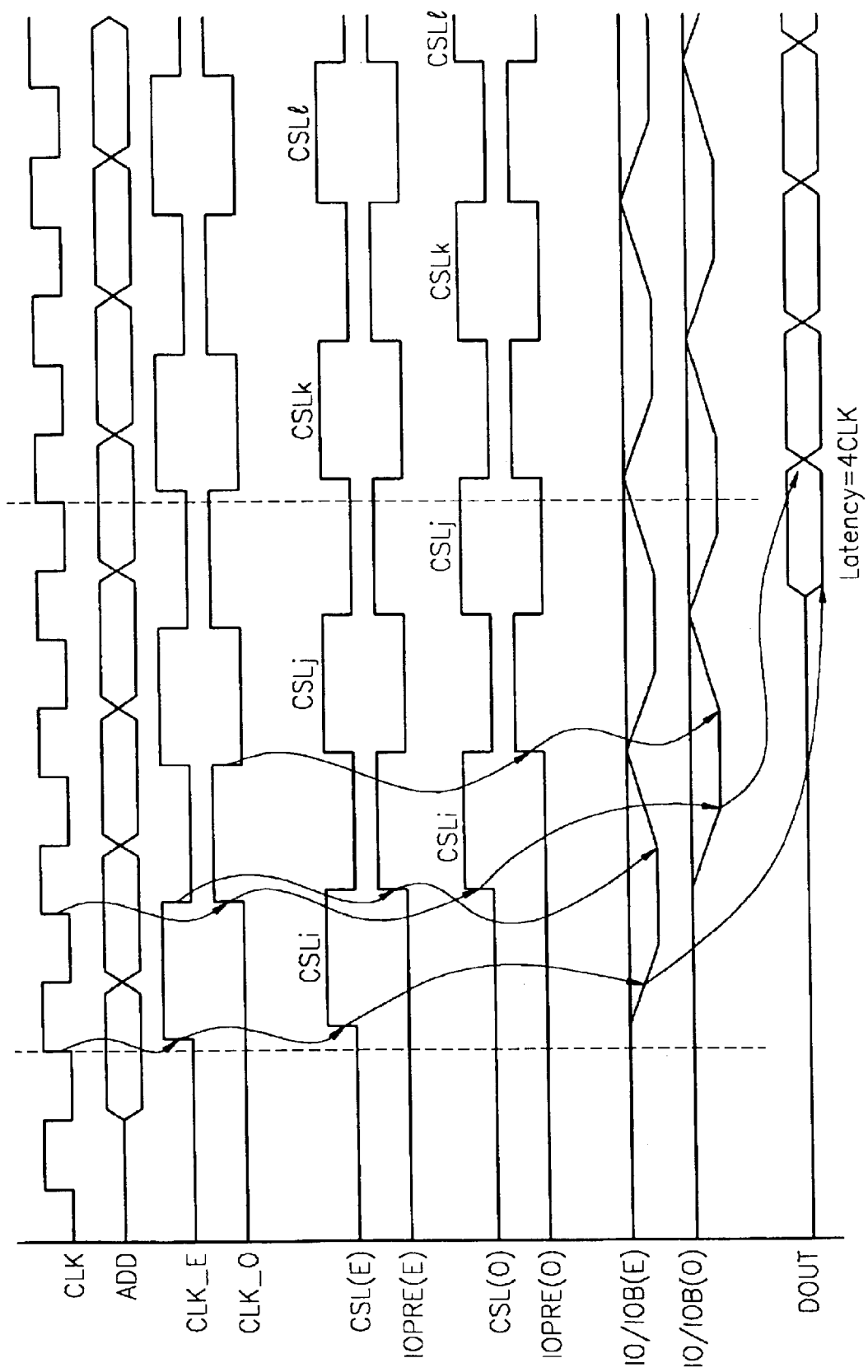
FIG. 4 is a timing diagram illustrating a read operation of the semiconductor memory device of FIG. 3.

FIG. 3 is a circuit diagram illustrating a semiconductor memory device having an input/output architecture according to a preferred embodiment of the present invention. FIG. 4 is a timing diagram illustrating a read operation of the semiconductor memory device of FIG. 3.

Referring to FIG. 3, the semiconductor memory device includes a memory cell array 30 that includes a plurality of memory cells MCi, MCj, . . . and, MCk; a frequency divider 31; a column address decoder 32; a column selection line enable control circuit 33; a switching circuit 34; an input/output (I/O) line sense amplification circuit and write driver 35; a first precharge circuit 36; a second precharge circuit 37; and an I/O buffer 38.

The frequency divider 31 (which includes the inverter illustrated in FIG. 3) divides a clock signal CLK input from external the semiconductor memory device by 2 and generates a clock signal CLK(E) for an even-numbered data patch and a clock signal CLK(O) for an odd-numbered data patch. The phase of the clock signal CLK(O) is opposite to that of the clock signal CLK(E). The column address decoder 32 decodes a column address ADD input from external the semiconductor memory device and provides the decoded result to the column selection line enable control circuit 33.

Upon receiving the decoded result from the column address decoder 32, the column selection line enable control circuit 33 generates even-numbered column selection line enable signals CSLi(E), CSLj(E), . . . , and CSLk(E) in response to the clock signal CLK(E) for an even-numbered data patch, and generates odd-numbered column selection line enable signals CSLi(O), CSLj(O), . . . , CSLk(O) in response to the clock signal CLK(O) for an odd-numbered data patch.

The switching circuit 34 connects pairs of bit lines BLi, BLj, . . . , and BLk, which are connected to the memory cells MCi, MCj, . . . , and MCk, to a pair of even-numbered I/O lines IO(E), in response to the even-numbered column selection line enable signals CSLi(E), CSLj(E), . . . , and CSLk(E). Also, the switching circuit 34 connects the pairs of bit lines BLi, BLj, . . . , and BLk to a pair of odd-numbered I/O lines IO(O), in response to the odd-numbered column selection line enable signals CSLi(O), CSLj(O), . . . , CSLk(O).

The switching circuit 34 includes switch transistors Mi(E), Mj(E), . . . , and Mk(E), and switch transistors Mi(O), Mj(O), . . . , and Mk(O). The switch transistors Mi(E), Mj(E), . . . , and Mk(E) connect the pairs of bit lines BLi, BLj, . . . , and BLk to the pair of even-numbered I/O lines IO(E), in response to the even-numbered column selection line enable signals CSLi(E), CSLj(E), . . . , and CSLk(E). The switch transistors Mi(O), Mj(O), . . . , and Mk(O) connect the pairs of bit lines BLi, BLj, . . . , and BLk to the pair of odd-numbered I/O lines IO(O), in response to the odd-numbered column selection line enable signals CSLi(O), CSLj(O), . . . , and CSLk(O).

The first precharge circuit 36 includes a precharge transistor 361 and a precharge control circuit 362, and precharges the pair of an even-numbered I/O lines IO(E) in response to the clock signal CLK(E) for an even-numbered data patch. The second precharge circuit 37 includes a precharge transistor 371 and a precharge control circuit 372, and precharges the pair of odd-numbered I/O lines IO(O) in response to the clock signal CLK(O) for an odd-numbered data patch.

The I/O line sense amplification circuit and write driver 35 includes an I/O line sense amplification circuit IOSA(E) 351a for even-numbered data; a write driver DRV(E) 351b for even-numbered data; an I/O line sense amplification circuit IOSA(O) 352a for odd-numbered data; and a write driver DRV(O) 352b for odd-numbered data.

During a read operation, the I/O line sense amplification circuit IOSA(E) 351a senses and amplifies data from the pair of even-numbered I/O lines IO(E), in response to the clock signal CLK(E) for an even-numbered data patch, and outputs the amplified data to a pair of data lines DIO. The I/O line sense amplification circuit IOSA(O) 352a senses and amplifies data from the pair of odd-numbered I/O lines IO(O) in response to the clock signal CLK(O) for an odd-numbered data patch, and outputs the amplified data to the pair of data lines DIO. The data from the pair of data lines DIO is output to an I/O pin DQ via the I/O buffer 38.

During a write operation, the write driver DRV(O) 351b receives even-numbered data from the pair of data lines DIO and transmits the data to the pair of even-numbered I/O lines IO(E), in response to the clock signal CLK(E) for even-numbered data. Also, the write driver DRV(O) 352b receives odd-numbered data from the pair of data lines DIO and transmits the data to the pair of odd-numbered I/O lines IO(O), in response to the clock signal CLK(O) for odd-numbered data.

As mentioned above, a semiconductor memory device according to the present invention is constructed such that (i) an external clock signal CLK is divided by 2 to thus generate a clock signal CLK(E) for an even-numbered data patch and a clock signal CLK(O) for an odd-numbered data patch, where the periods of the clock signals CLK(E) and CLK(O) are double that of the external clock signal CLK; and (ii) the two pairs of I/O lines IO(E) and IO(O) correspond to the two clock signals CLK(E) and CLK(O). As explained below, such a structure enables an increase in the data transmitting speed of the memory device.

Unlike a conventional semiconductor memory device, a semiconductor memory device according to the present invention can operate even if another column address is input during development and precharging of the pair of even-numbered I/O lines IO(E).

That is, when another column address is input while precharging the pair of even-numbered I/O lines IO(E), one of the odd-numbered column selection line enable signals CSLi(O), CSLj(O), . . . , and CSLk(O) is enabled in response to the clock signal CLK(O) for odd-numbered data. Then, one of the switch transistors Mi(O), Mj(O), . . . , and Mk(O) is turned on, and one of the pairs of bit lines BLi, BLj, . . . , and BLk is connected to the pair of odd-numbered I/O lines IO(O) while development of the pair of odd-numbered I/O lines IO(O) is performed. Accordingly, the write and read operations are improved. Further, the alternating operation results in noise dispersion, thereby preventing or reducing speed degradation caused by noise.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device that performs read and write operations in synchronization with an external clock signal, comprising:

a frequency divider that divides the external clock signal by two and that generates a first clock signal for an even-numbered data patch and a second clock signal for an odd-numbered data, wherein the first clock signal is opposite in phase to the second clock signal;

a column selection line enable control circuit that generates even-numbered column selection line enable signals in response to the first clock signal and that generates odd-numbered column selection line enable signals in response to the second clock signal;

a switching circuit that connects a pair of bit lines to a pair of even-numbered input/output (I/O) lines in response to the even-numbered column selection line enable signals and that connects the pair of bit lines to a pair of odd-numbered I/O lines in response to the odd-numbered column selection line enable signals; and an I/O line sense amplification circuit that senses and amplifies even-numbered read data from the pair of even-numbered I/O lines and outputs the amplified even-numbered read data to a pair of data lines in response to the first clock signal, and that senses and amplifies odd-numbered read data from the pair of odd-numbered I/O lines and outputs the odd-numbered read data to the pair of data lines in response to the second clock signal.

2. The semiconductor memory device of claim 1, further comprising a column address decoder that decodes an externally supplied column address and that provides the decoded column address to the column selection line enable control circuit.

3. The semiconductor memory device of claim 1, further comprising a write driver that receives even-numbered write data from the pair of data lines and provides the even-numbered write data to the pair of even-numbered I/O lines in response to the first clock signal, and that receives odd-numbered write data from the pair of data lines and provides the odd-numbered write data to the pair of odd-numbered I/O lines in response to the second clock signal.

4. The semiconductor memory device of claim 1, further comprising a first precharge circuit that precharges the pair of even-numbered I/O lines in response to the first clock signal, and a second precharge circuit that precharges the pair of odd-numbered I/O lines in response to the second clock signal.

* * * * *